United States Patent
Ma

(10) Patent No.: US 7,112,068 B2
(45) Date of Patent: Sep. 26, 2006

(54) LAND GRID ARRAY SOCKET HAVING CONTACT-PROTECTING MECHANISM

(75) Inventor: Hao-Yun Ma, Tu-chen (TW)

(73) Assignee: Hon Hai Precision Inc. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/102,028

(22) Filed: Apr. 7, 2005

(65) Prior Publication Data
US 2006/0003614 A1 Jan. 5, 2006

(30) Foreign Application Priority Data
Jun. 30, 2004 (TW) .............................. 93119331 A

(51) Int. Cl.
*H01R 12/00* (2006.01)
(52) U.S. Cl. ........................................ 439/71; 439/331
(58) Field of Classification Search ................ 439/71, 439/72, 73, 135, 331
See application file for complete search history.

(56) References Cited
U.S. PATENT DOCUMENTS

| 5,713,744 A * | 2/1998 | Laub ............................. 439/71 |
| 5,921,814 A | 7/1999 | Maruyama |
| 6,071,151 A | 6/2000 | Igarashi |
| 6,685,494 B1 * | 2/2004 | McHugh et al. ............ 439/342 |
| 6,692,279 B1 * | 2/2004 | Ma ............................. 439/331 |
| 6,716,050 B1 * | 4/2004 | Ma et al. ..................... 439/331 |
| 6,776,625 B1 * | 8/2004 | Ma ............................. 439/73 |
| 6,899,553 B1 * | 5/2005 | Ma et al. ..................... 439/135 |
| 2003/0100201 A1 * | 5/2003 | Ikeya et al. ................... 439/73 |
| 2003/0114034 A1 * | 6/2003 | Sano et al. ................. 439/331 |
| 2004/0095693 A1 * | 5/2004 | Shirai et al. ................... 361/1 |

* cited by examiner

*Primary Examiner*—Tulsidas C. Patel
*Assistant Examiner*—Vladimir Imas
(74) *Attorney, Agent, or Firm*—Wei Te Chung

(57) ABSTRACT

An LGA socket includes a socket body (10), a number of contacts planted in the socket body, a hollowed floating frame (50) floating on a number of push fingers (11) formed on the socket body, a stiffener (20) disposed right round the socket body and the floating frame, and a socket plate (40) and a load lever (30) respectively mounted to opposite ends of the stiffener. The floating frame is provided with a number of receiving sections (54) to hold an LGA package (60). The floating frame with the LGA package held thereon is vertically movable between a free state in which the conductive pads of the LGA package do not engage with the contacts, and a compressed state in which the conductive pads of the LGA package resiliently register with corresponding contacts. Thus, damage to the contacts during installation is avoided and reliable electrical connection is ensured.

19 Claims, 10 Drawing Sheets

LAND GRID ARRAY SOCKET HAVING CONTACT-PROTECTING MECHANISM

BACKGROUND OF THE INVENTION

1. Field of the Invention

The present invention relates generally to electrical connectors, and more particularly to a land grid array (LGA) socket having contact-protecting mechanism for electrically connecting an LGA package with a circuit substrate, such as a printed circuit board (PCB).

2. Description of the Prior Art

An integrated circuit package having conductive pads arranged on a bottom surface thereof in an LGA fashion is known as an LGA package. LGA packages have been widely used due to relatively low height and reliable electrical characteristics.

Connectors for removably connecting an LGA package with a PCB are known as LGA sockets. Normally, an LGA socket comprises a socket body, a plurality of contacts received in the socket body, a stiffener attached to the socket body, and a socket plate and a load lever pivotally attached to opposite ends of the stiffener respectively. The socket plate and the load lever can rotate relative to the stiffener to jointly hold the LGA package on the LGA socket or release the LGA package from the LGA socket.

Turning to FIGS. 9 and 10, there is shown a conventional LGA socket 8 comprising a socket body 82, a plurality of contacts 81 received in the socket body 82, a stiffener 83 attached to the socket body 82, and a load lever 86 and a socket plate 84 pivotally assembled to opposite ends of the stiffener 83, respectively. When the contact 81 is correspondingly accommodated in the socket body 82, spring arm 88 of the contact 81 protrudes from an upper surface of the socket body 82, to resiliently and electrically register with a corresponding conductive pad (not shown) arranged on a bottom surface of an LGA package 100.

In operation, prior to rotating the socket plate 84 onto a top surface of the LGA package 100, the LGA package 100 is appropriately set on the socket body 82 with the conductive pads thereof mating with corresponding spring arms 88 of the contacts 81. A driving arm 85 of the load lever 86 is urged to drive the LGA package 100 to move downwardly. In a close position, the conductive pads arranged on the LGA package 100 substantially engage with corresponding spring arms of the contacts 81, and electrical connection between the LGA package 100 and a PCB is achieved.

During installation of the LGA package 100, the LGA package 100 need to be vertically set on the socket body 82 so that the conductive pads of the LGA package 100 can appropriately contact with the corresponding spring arms 88 of the contacts 81. Generally, the installation of the LGA package 100 is manually operated and the LGA package 100 is susceptible to be inclined with respect to the socket body 82. As a consequence, the LGA package 100 is liable to contact with some of the spring arms 88 foremost. This tends to cause inadvertent damage to the contacts 81 and impact reliability of the electrical connection between the LGA socket 8 and the PCB. This problem arises particularly in high density and miniaturized LGA socket wherein the contacts are very closely spaced in a compact array.

Hence, it is strongly desired to provide a new LGA socket which overcomes the disadvantages of the prior art described immediately above.

SUMMARY OF THE INVENTION

Accordingly, a primary object of the present invention is to provide a land grid array (LGA) socket having contact-protecting mechanism for electrically connecting an LGA package with a printed circuit board (PCB), wherein the contact-protecting mechanism can prevent contacts received in the LGA socket from being damaged during installation of the LGA package.

To fulfill the above-mentioned object, a new LGA socket provided in accordance with the present invention comprises a socket body, a plurality of contacts received in the socket body, a floating frame floating on a spring mechanism disposed on the socket body, a stiffener arranged right round the socket body and the floating frame, and a socket plate and a load lever connected to opposite ends of the stiffener, respectively. Top section of each contact in a free state jointly defines a contacting plane. The floating frame is provided with a plurality of receiving sections for holding the LGA package thereon. The floating frame can move vertically with respect to the contacting plane between a first position in which conductive pads arranged on the LGA package situated above the contacting plane, and a second position in which the conductive pads arranged on the LGA package situated below the contacting plane and resiliently registering with corresponding contacts received in the socket body.

In the first position, the LGA package is set on the floating frame, with the bottom surface thereof staying above and in substantially parallel with the contacting plane. When the LGA package is pressed down under a loading force, the floating frame together with the LGA package rest thereon, moves downwardly and vertically with respect to the contacting plane. In whole course of urging the LGA package, the bottom surface of the LGA package is in parallel with the contacting plane all along. As a result, the conductive pads arranged on the LGA package simultaneously register with corresponding contacts. Therefore, the contacts are free from being damaged by the LGA package, and reliable electrical interconnection between the LGA package and the PCB is ensured.

Other objects, features and advantages of the present invention will become more apparent from the following detailed description when taken in conjunction with the accompanying drawings.

BRIEF DESCRIPTION OF THE DRAWINGS

The features of the present invention which are believed to be novel are set forth with particularity in the appended claims. The invention, together with its object and the advantage thereof, may be best understood by reference to the following detailed description when taken in conjunction with the accompanying drawings, in which like reference numerals identify like elements in the figures and in which:

DETAILED DESCRIPTION OF THE PREFERRED EMBODIMENT OF THE INVENTION

Reference will now be made to describe the preferred embodiment of the present invention in detail.

Figure 1:
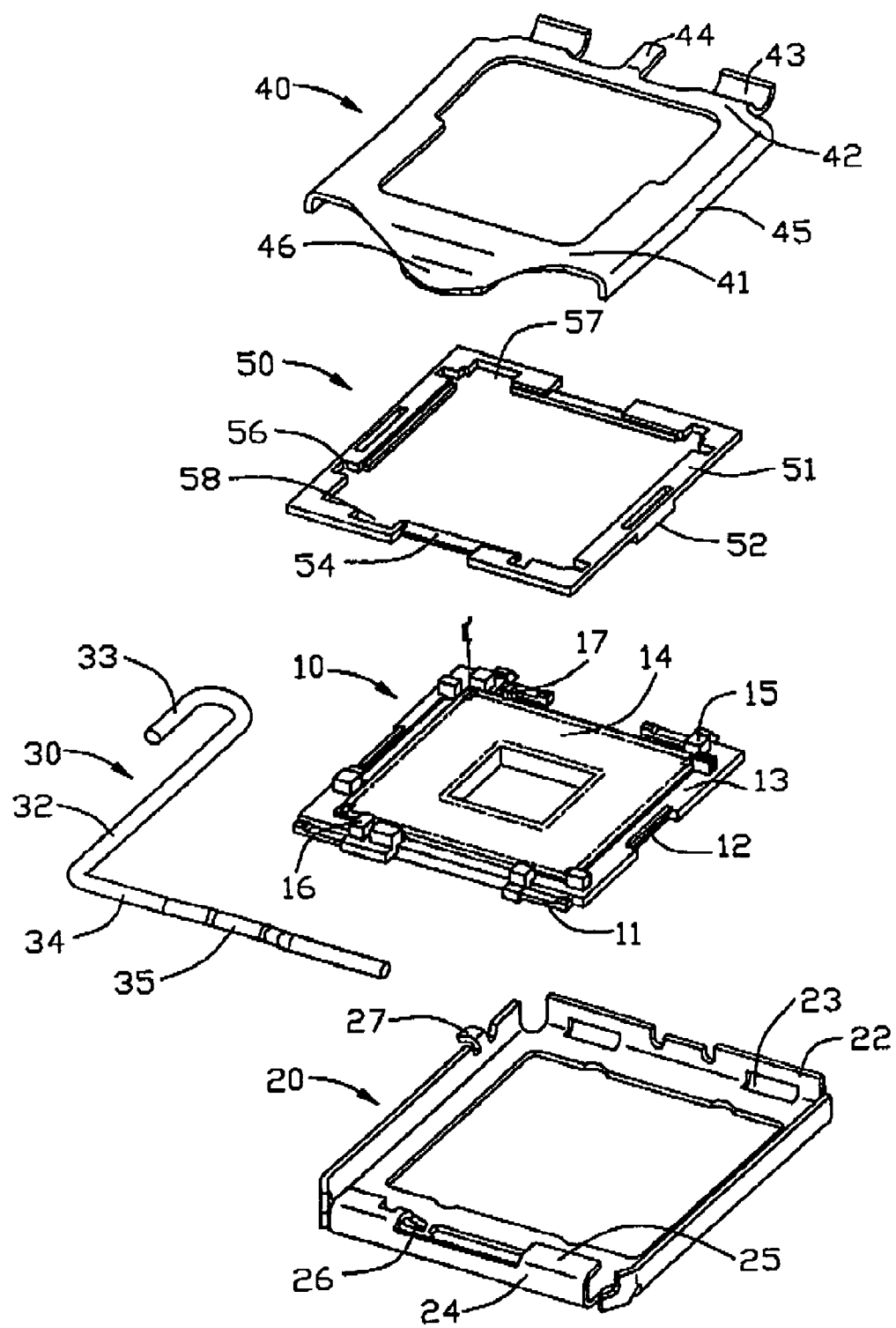
FIG. 1 is an exploded, isometric view of an LGA socket according to a preferred embodiment of the present invention.
Figure 2:
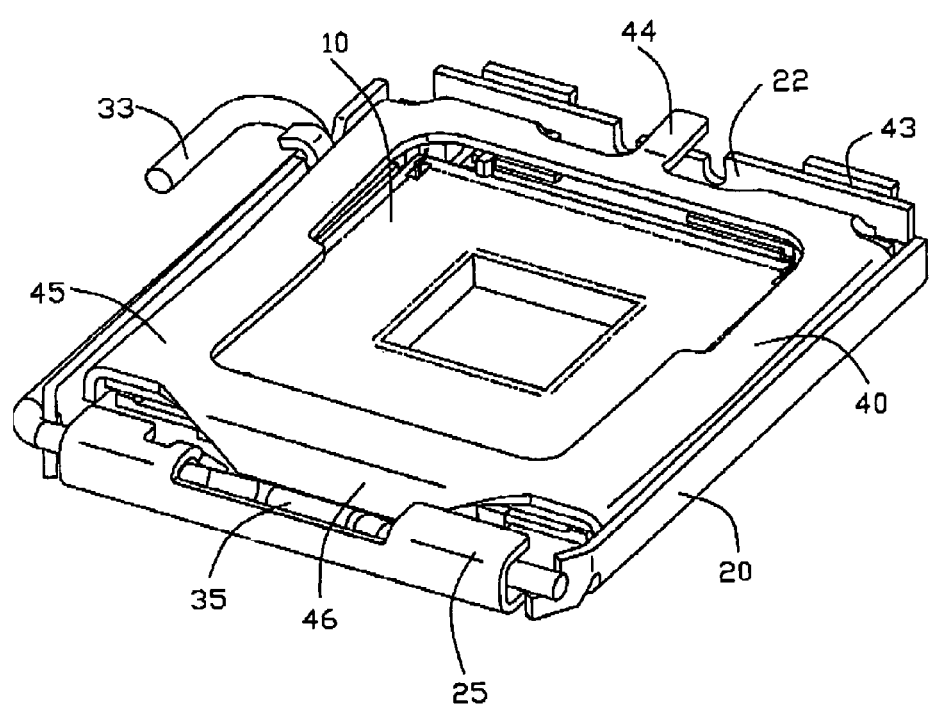
FIG. 2 is an assembled, isometric view of the LGA socket shown in FIG. 1.
Figure 3:
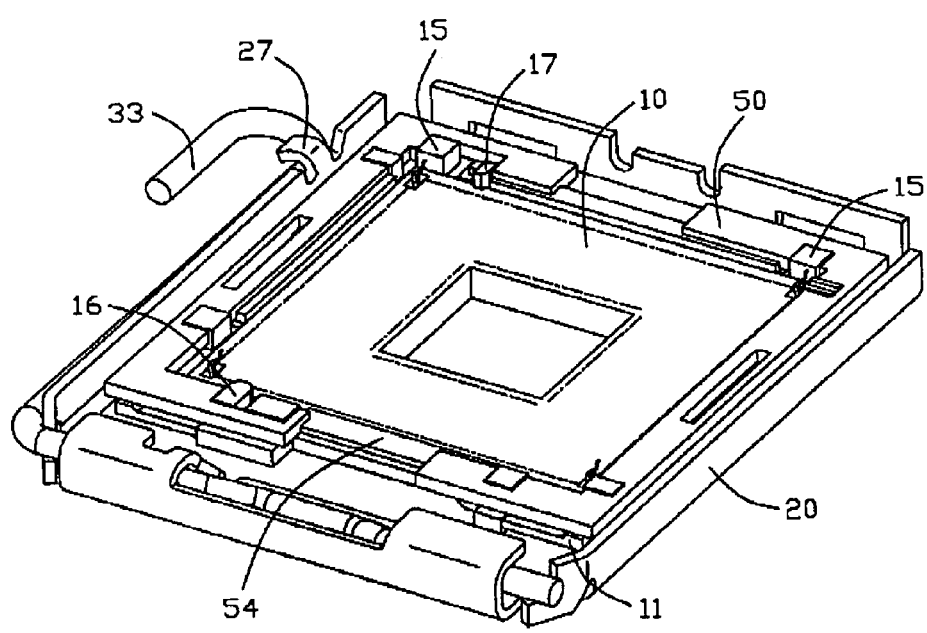
FIG. 3 is similar to FIG. 2, but showing a socket plate of the LGA socket been disassembled therefrom.

Referring to FIGS. 1 to 3, an LGA socket in accordance with a preferred embodiment of the present invention includes a socket body 10, a plurality of contacts (not shown) received in the socket body 10, a floating frame 50 floating on a plurality of flexible push fingers 11 formed on the socket body, a stiffener 20 arranged right round the socket body 10 and the floating frame 50, and a socket plate 40 and a load lever 30 pivotally attached to opposite ends of the stiffener 20, respectively.

Figure 4:
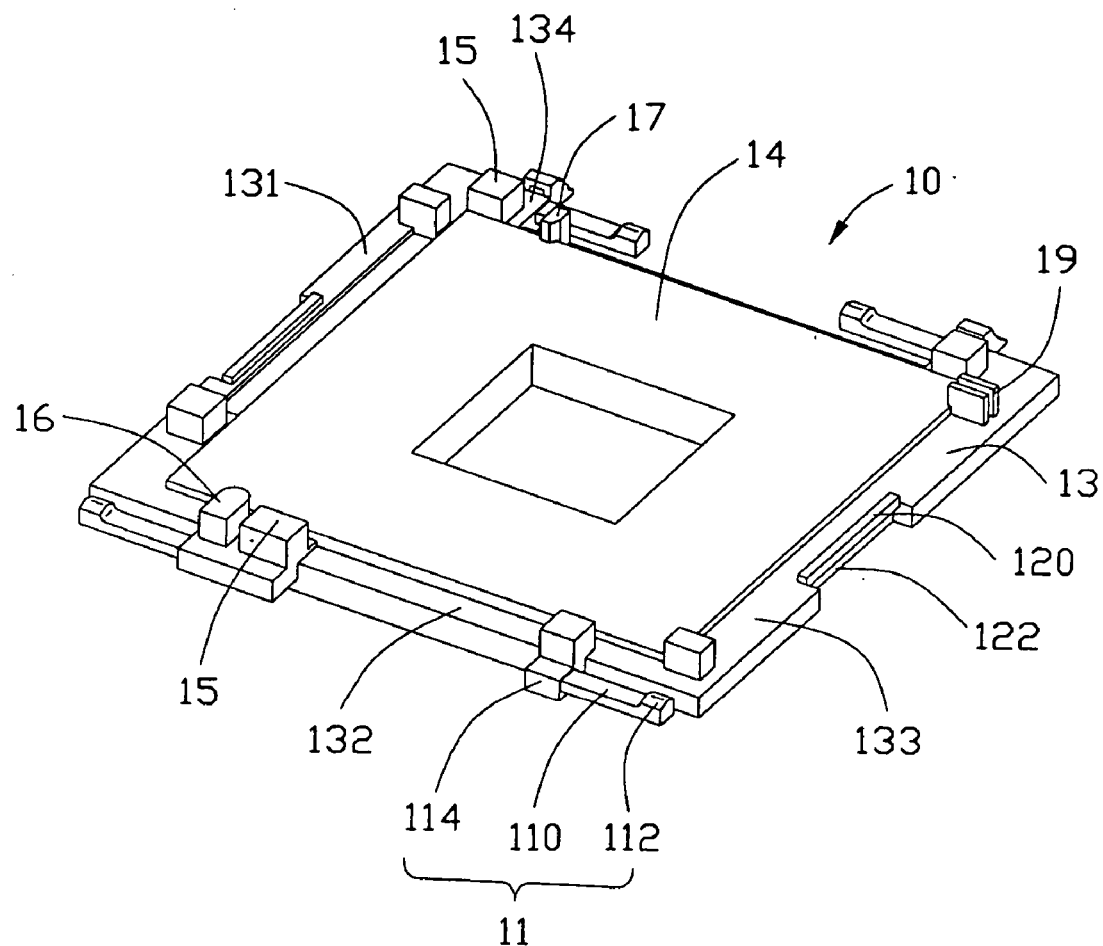
FIG. 4 is an isometric view of a socket body of the LGA socket shown in FIG. 1.
Figure 5:
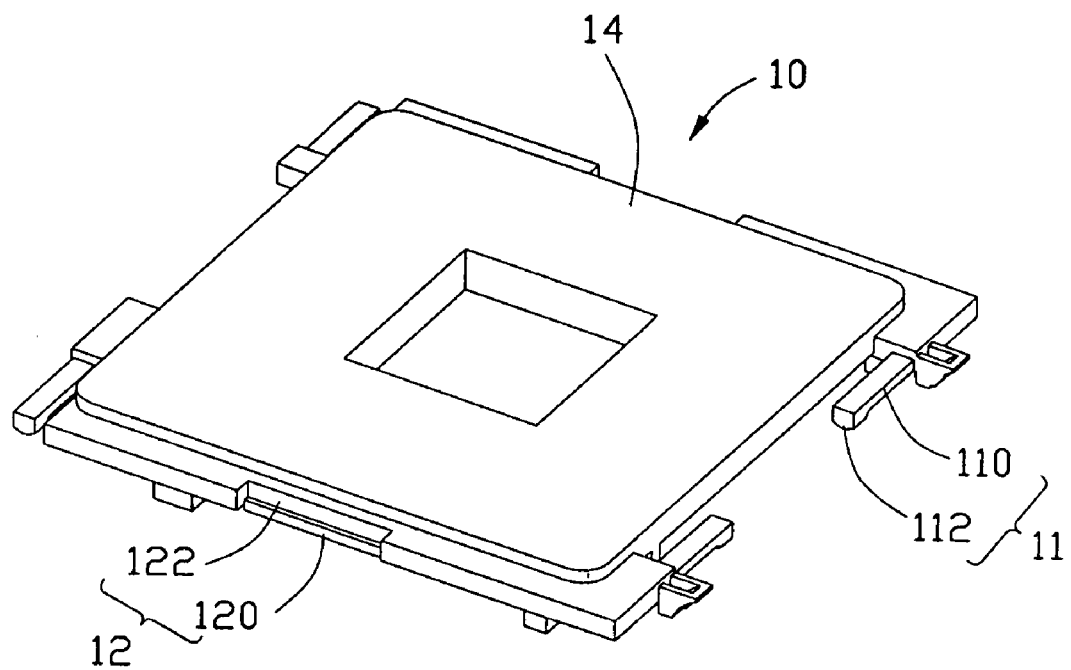
FIG. 5 is similar to FIG. 4, but showing an isometric view of the socket body of FIG. 4 from another view.

Referring to FIGS. 4 and 5, the dielectric socket body 10 comprises an opening (not labeled) in a center thereof, a body section 13 at an outer side thereof, and an electrical region 14 recessed with respect to an upper surface of the body section 13 therebetween. The body section 13 has a front wall 132, a rear wall 134, and a pair of opposite lateral walls 131, 133 respectively and integrally connected to two ends of the front wall 132 and the rear wall 134. The electrical region 14 is defined with a plurality of passageways (not shown) extending vertically therethrouth to receive corresponding contacts therein. Top section of each contact in a free state jointly defines a contacting plane (not shown). Each of the front wall 132, the rear wall 134 and the lateral wall 131 is provided with a pair of first protrusions 15 projecting from the upper surface of the body section 13 at opposite side thereof. The lateral wall 133 is formed with a first protrusion 15 at one side thereof and two parallel planar boards 19 extending upwardly at an opposite side.

A second protrusion 16 having a curved surface facing the electrical region 14 is formed on the front wall 132, and lies between the first protrusion 15 and the lateral wall 131. Other surfaces of the second protrusion 16 are in planar configuration. A third protrusion 17 is provided on the rear wall 134 corresponding to the second protrusion 16. The third protrusion 17 includes a flattened corner at one side adjacent the electrical region 14. Top surfaces of the first protrusions 15, the second protrusion 16, the third protrusion 17 and the planar boards 19 are in a same plane.

The opposite lateral walls 131, 133 each defines a locking section 12 in a middle thereof. The locking section 12 includes an extending section 120 and a recessed section 122 adjacent the extending section 120. Both the extending section 120 and the recessed section 122 recess a certain distance with respect to an outer side of the lateral walls 131,133, wherein the recessed section 122 recesses even further. The extending section 120 and the recessed section 122 jointly forms a step-configuration to correspondingly mate with a latch 52 of the floating frame 50.

A pair of push fingers, i.e., the spring mechanisms or the urging device, 11 is integrally formed with the socket body 10 on the front wall 132 thereof. Each push finger 11 has a connecting section 114 projecting outwardly fain the front wall 132, a cantilevered arm 110 connected to the connecting section 114 and in parallel with the front wall 132, and a curved bugle or engaging section 112 extending upwardly at a free end thereof. The curved bugles 112 extend upwardly and protrude a certain distance from the upper surface of the body section 13. The cantilevered arm 110 of the push fingers 11 has a relatively long length and favorable flexibility accordingly. When the curved bugle 112 is pressed down under a loading force, the cantilevered arm 110 swings slightly around the connecting section 114 as well as deforms downwardly.

The rear wall 134 is also provided with a pair of push fingers 11. The push fingers 11 formed on the rear wall 134 have a same configuration as that of the push fingers 11 formed on the front wall 132, except that the two push finger 11 formed on the front wall 132 extend away from each other, while the two push fingers 11 formed on the rear wall 134 extend toward each other.

Figure 6:
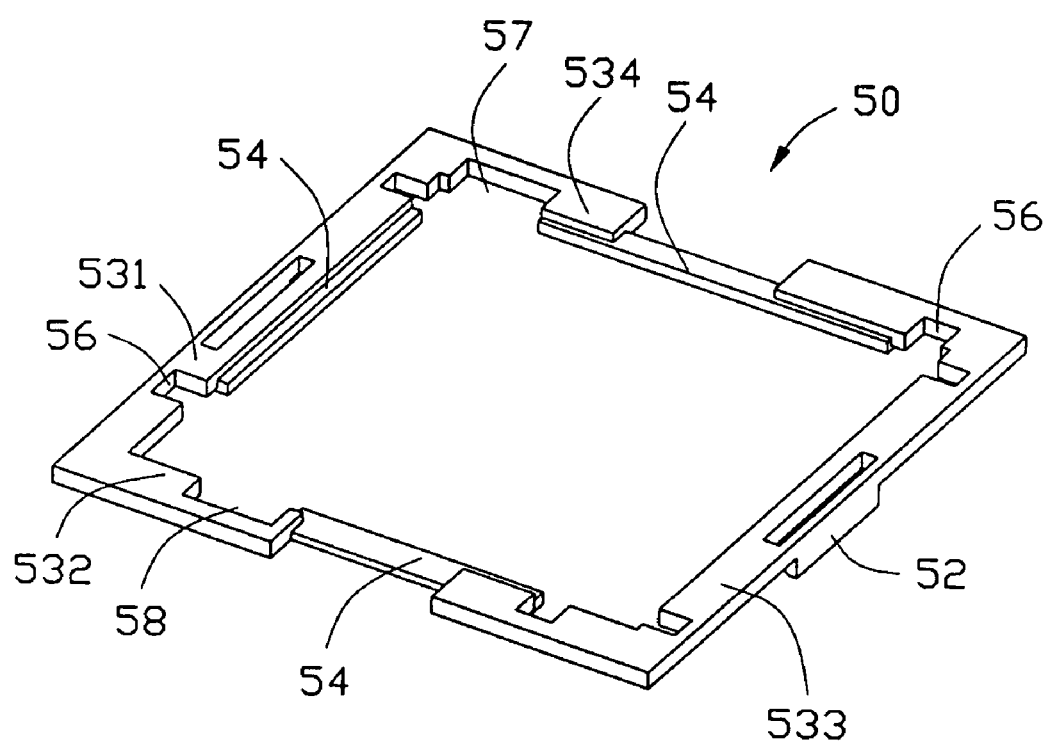
FIG. 6 is an isometric view of a floating frame of the LGA socket shown in FIG. 1.
Figure 7:
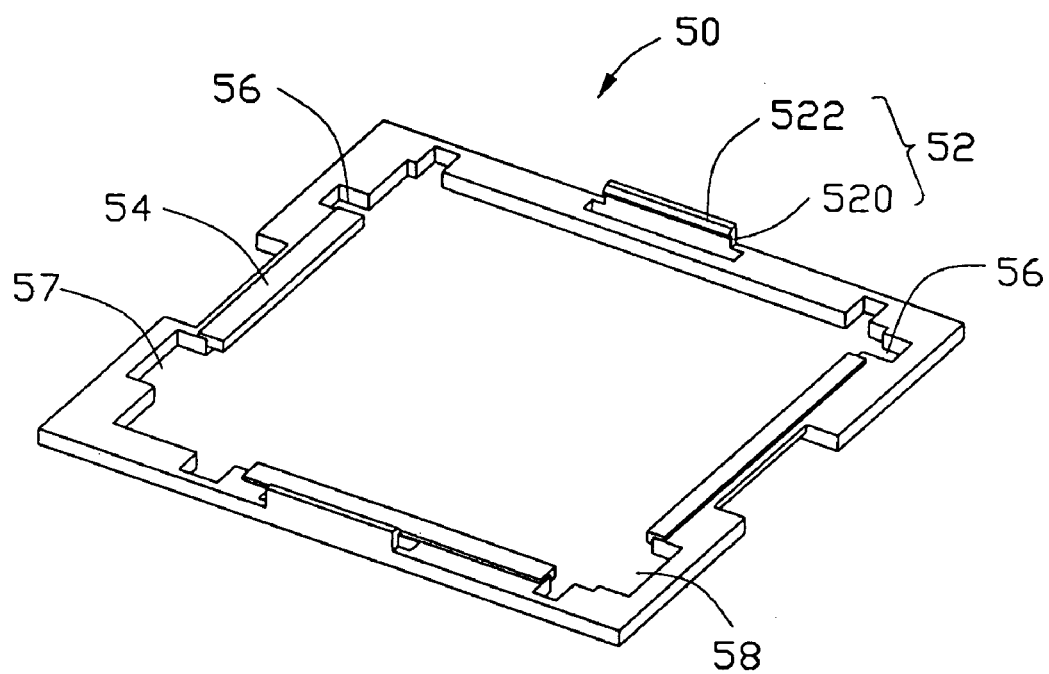
FIG. 7 is similar to FIG. 6, but showing an isometric view of the floating frame of FIG. 6 from another view.

Referring to FIGS. 1, 6 and 7, the floating frame 50 is an insulative planar frame defining an opening (not labeled) in a center thereof. The floating frame 50 includes a front side 532, a rear side 534, and a pair of lateral sides 531, 533 respectively and integrally connecting two ends of the front side 532 and the rear side 534. The lateral side 531, the front side 532 and the rear side 534 each is provided with a receiving section 54 extending toward the opening from the sides 531, 532 and 534. Upper surfaces of each receiving section 54 are in a same plane recessed with respect to an upper surface of the floating frame 50 to form a step-shape configuration for cooperatively holding the LGA package thereon securely.

A pair of cantilevered latches 52 is formed in a middle of the lateral sides 531 and 533, to clip the corresponding locking section 12 of the socket body 10 and assemble the floating frame 50 onto the socket body 10. The cantilevered latch 52 comprises a perpendicular section 520 extending from the lateral sides 531, 533, and a hook 522 disposed at a distal end of the perpendicular section 520 to engage with the extending section 122 of the locking section 12.

Figure 8:
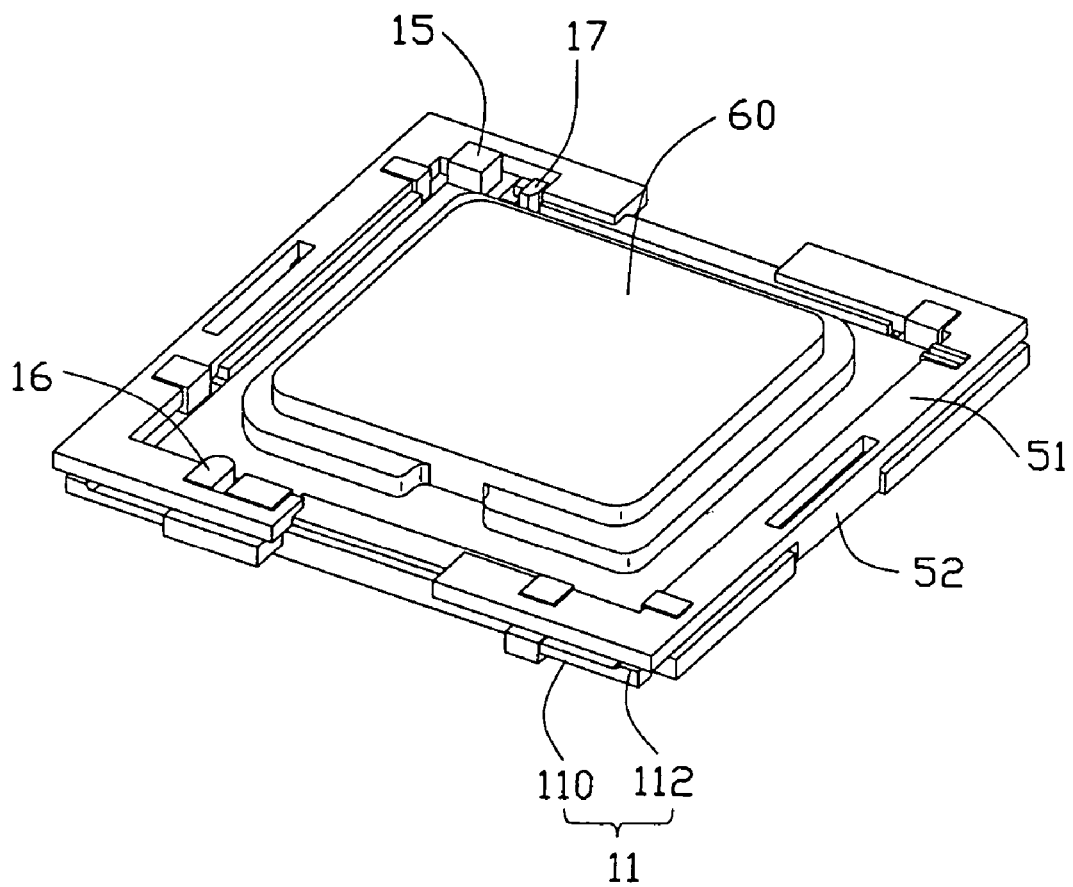
FIG. 8 is an assembled, isometric view of an LGA package, a floating frame and the socket body.
Figure 9:
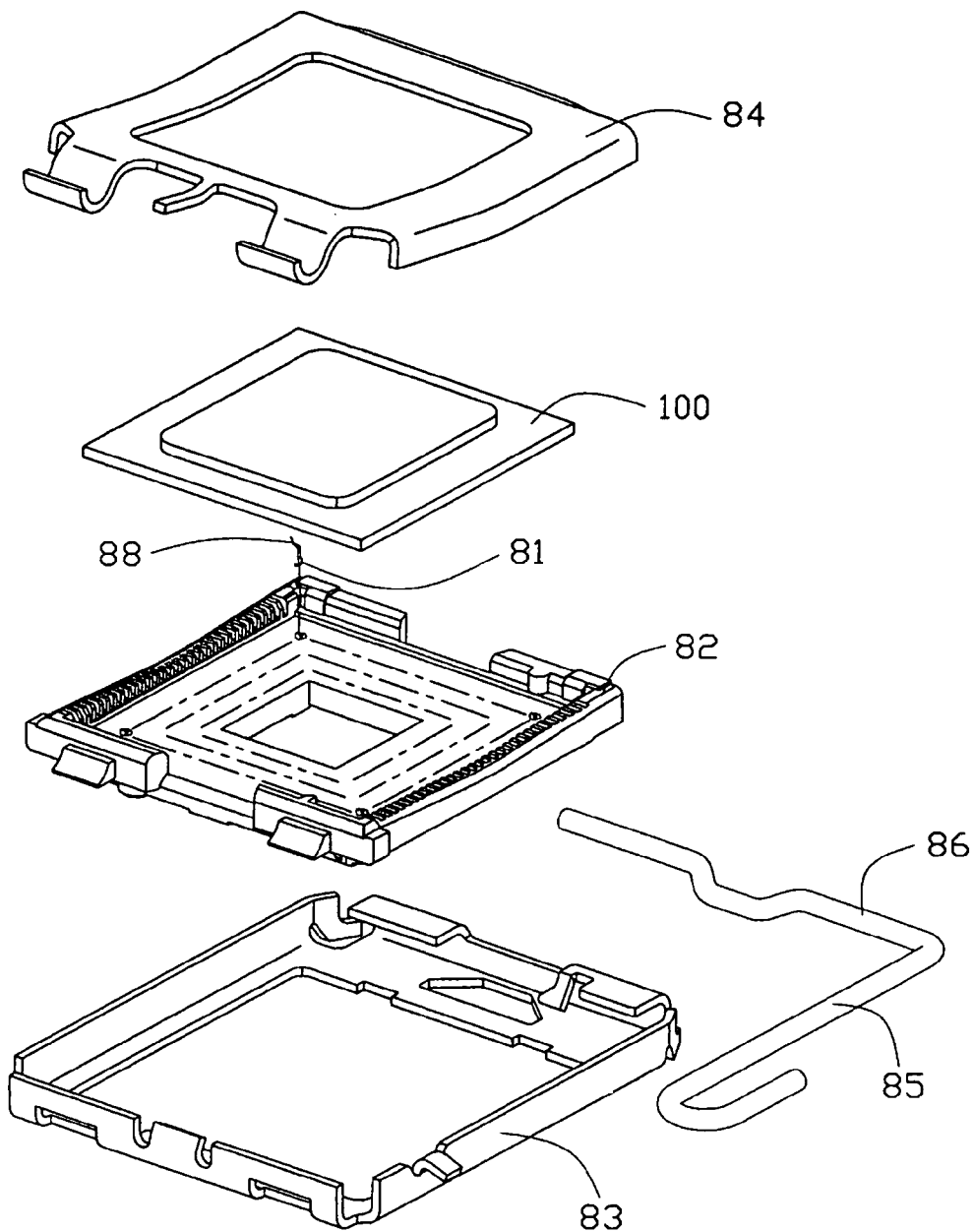
FIG. 9 is an exploded, isometric view of a conventional LGA socket, with an LGA package to be received thereon.
Figure 10:
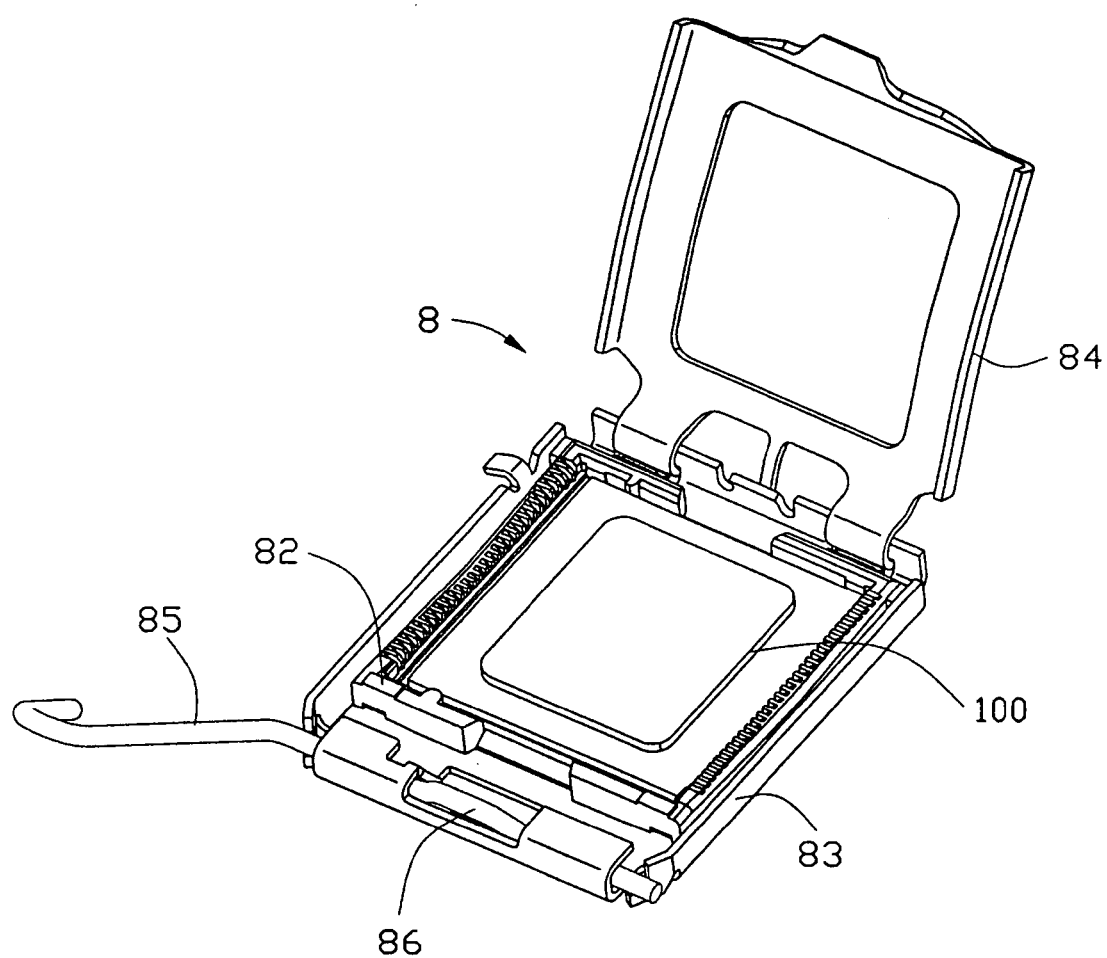
FIG. 10 is an assembled, isometric view of the conventional LGA socket and the LGA package shown in FIG. 9.

Referring to FIGS. 4, 6 and 8, a plurality of guiding grooves 56, 57 and 58 are defined at each corner of the floating frame 50, to correspondingly receive the protrusions 15, 16 and 17 formed on the socket body 10. A second guiding groove 58 defined in the front side 532 is configured to receive the second protrusion 16 and the first protrusion 15 adjacent the second protrusion 16 therein. A third guiding groove 57 is provided in the rear side 534 to accommodate a corresponding first protrusion 15 and a third protrusion 17 therein. A plurality of first guiding grooves 56 is defined in the floating frame 50 to accommodate corresponding first protrusions 15 and the planar boards 19 therein, respectively. The first guiding groove 56 has a width less than that of the second guiding groove 58 and the third guiding groove 57.

In another embodiment of the present invention, the first protrusion 15 has a different configuration, such as a column configuration, and position from that of the second protrusion 16 and the third protrusion 17, so that misalignment during course of locking the floating frame 50 onto the socket body 10 can be avoided.

Referring to FIG. 1, the load lever 30 is generally an L-shape metal crank shaped via bending. The load lever 30 includes a driving section 32 and a retaining section 34 substantially perpendicular to the driving section 32. A handle 33 is formed at a distal end of the driving section 32 for facilitating operation of the load lever 30. An offset fastening section 35 is formed at a center of the retaining section 34 to engage with a pressing end 46 of the socket plate 40.

The hollowed planar socket plate 40 comprises a foreside 41, a rear-side 42, and a pair of opposite lateral sides (not labeled) respectively and integrally connecting two ends of the foreside 41 and the rear-side 42. The foreside 41 is formed with a pressing end 46 extending forth from a middle thereof, to mate with the fastening section 35 of the load lever 30. The rear-side 42 is provided with a slightly upward bent positioning section 44 and a pair of braces 43 symmetrically disposed at two opposite sides thereof. The opposite lateral sides each forms a slightly downward bent clasping section 45 in a middle thereof, to engage with a top surface of the LGA package 60.

The metal stiffener 20 has a rectangular configuration adapted to receive the socket body 10 and the floating frame 50 assembled thereto. The stiffener 20 includes a rear sidewall 22 connected to the rear-side 42, a front sidewall 24 opposite to the rear sidewall 22 to receive the load lever 30, and a pair of lateral sidewalls (not labeled) respectively and integrally connecting two ends of the front sidewall 24 and the rear sidewall 22.

The rear sidewall 22 defines a pair of slots 23 to correspondingly receive the braces 43 of the rear-side 42 pivotally. The front sidewall 24 forms a pair of securing section 25 at opposite side thereof and an inby bent containing section 26 adjacent the securing section 25. The securing section 25, the containing section 26 and two distal ends (not labeled) of the opposite lateral sidewalls of the stiffener 20 jointly defines a space, to pivotally hold the load lever 30 in a proper position. A curved locking block 27 is formed at one lateral sidewalls of the stiffener 20 in accordance with the load lever 30, to receive part of the driving section 32 thereunder.

Referring to FIGS. 1 to 3 and FIG. 8, in assembly, the socket plate 40 and the load lever 30 are pivotally assembled to the rear sidewall 22 and the front sidewall 24 of the stiffener 20, respectively. Both the socket plate 40 and the load lever 30 are rotated afar relative to the socket body 10, to facilitate the assembly of the socket body 10 and the floating frame 50.

The protrusions 15, 16, 17 and the planar boards 19 are register with corresponding guiding grooves 56, 57 and 58, to lock the floating frame 50 onto the socket body 10. The floating frame 50 is pressed down until the cantilevered latches 52 engage with the corresponding locking section 12. The thin planar boards 19 having favorable flexibility shrink to facilitate assembly of the floating frame 50 when pressed, and rebound to firmly secure the floating frame 50 on the socket body 10.

When the floating frame 50 is assembled on the socket body 10, the push fingers 11 jointly provide an upward floating force to support the floating frame 50 so that the floating frame 50 does not contact with the upper surface of the socket body 10. The socket body 10, together with the floating frame 50 fixed thereon, is attached to the stiffener 20 with the stiffener 20 lying right round the socket body 10 and the floating frame 50.

In use, the LGA socket is first set in an open position with the load lever 30 and the socket plate 40 rotated afar with respect to the socket body 10. The LGA package 60 is appropriately set on the receiving sections 54 of the floating frame 50. Then the socket plate 40 is rotated to rest on the top surface of the LGA package 60. In this way, the LGA socket is set in a first position, in which the contacts planted in the socket body 10 are in a free state and do not contact with the conductive pads of the LGA package 60.

The fastening section 35 of the load lever 30 is driven to mate with the pressing end 46 of the socket plate 40, so that the floating frame 50 with the LGA package 60 held thereon is urged to move downwardly. When the floating frame 50 contacts with the curved bugles 112 of the push finger 11, deformation is occurred to the push fingers 11 and a counteractive rebound force is induced accordingly to support the floating frame 50.

The load lever 30 is further urged to overcome the counterforce of the push fingers 11 and drive the LGA package 60 move downwardly to reach a second position. In the second position, the contacts are in a compressed state and register with corresponding conductive pads arranged on the LGA package 60. After the driving section 32 is partly held in the locking hook 27, the floating frame 50, together with the LGA package 60 held thereon, is transferred to a balanced position under the counterforce of the push fingers 11, and the contacts resiliently mate with corresponding conductive pads of the LGA package 60. Thus, the LGA package 60 is securely held on the LGA socket and electrical connection between the LGA package 60 and the PCB is obtained.

In the first position, the LGA package 60 is set on the receiving sections of the floating frame 50, with the bottom surface thereof lying above and in substantially parallel with the contacting plane. When the LGA package 60 is pressed down, the floating frame 50, together with the LGA package 60 held thereon, moves downwardly and vertically with respect to the contacting plane. In whole course of urging the LGA package 60 to engage with the contacts, the bottom surface of the LGA package 60 is in parallel with the contacting plane all along. As a result, the conductive pads of the LGA package 60 simultaneously register with corresponding contacts. Therefore, the contacts are free from being damaged by the LGA package 60, and reliable electrical connection between the LGA package 60 and the PCB is ensured.

It is noted that the floating frame 50 can also be set on the socket body 10 via other appropriate means, such as holes defined in corresponding walls 13 of the socket body 10 and springs received therein, on condition that the floating frame 50 rest on the springs can move vertically between a free state and a compressed state like the free state and the compressed state of the floating frame 50 in the above-mentioned embodiment.

While the present invention has been described with reference to a specific embodiment, the description of the invention is illustrative and is not to be construed as limiting the invention. Various modifications to the present invention can be made to the preferred embodiment by those skilled in the art without departing from the true spirit and scope of the invention as defined by the appended claims.

I claim:

1. A land grid array (LGA) socket for electrically connecting an LGA package with a circuit substrate, the LGA socket comprising:
   a socket body defining a plurality of passageways extending therethrough;
   a plurality of contacts correspondingly received in the passageways, top section of each contact in a free state cooperatively defining a contacting plane;
   a spring mechanism disposed on the socket body;
   a floating frame defining a plurality of receiving sections floated on the spring mechanism and vertically movable between a first position in which a bottom surface of the LGA package situated above the contacting plane, and a second position in which the bottom surface of the LGA package situated below die contacting plane;
a stiffener disposed around the socket body and the floating frame; and
a socket plate and a load lever respectively assembled to opposite ends of the stiffener to maintain the LQA package thereunder.

2. The LGA socket as defined in claim 1, wherein the spring mechanism comprises a plurality of push fingers disposed around the socket body.

3. The LGA socket as defined in claim 2, wherein the push fingers are formed on the socket body at opposite sides thereof in pairs, with one pair of push fingers extending toward each other while the other pair of push fingers extending away from each other.

4. The LGA socket as defined in claim 3, wherein each push finger comprises a connecting section projecting from the socket body, a cantilevered arm connected to the connecting section, and a curved bugle extending upwardly at a distal end of the cantilevered arm.

5. The LGA socket as defined in claim 1, wherein the spring mechanism is a plurality of springs correspondingly arranged between the floating frame and the socket body.

6. The LGA socket as defined in claim 1, wherein the socket body comprises a plurality of walls with a plurality of protrusions formed thereon, and the floating frame is correspondingly provided with a plurality of guiding grooves to receive the protrusions.

7. The LGA socket as defined in claim 6, wherein at least one protrusion has a configuration different from configurations of other protrusions.

8. The LGA socket as defined in claim 7, wherein the socket body is provided with a pair of planar boards extending upwardly at one wall thereof, and the floating frame correspondingly defines a guiding groove to receive the planar boards.

9. The LGA socket as defined in claim 1, wherein an upper surface of the receiving section is recessed downwardly with respect to an upper surface of the socket body.

10. The LGA socket as defined in claim 9, wherein the floating frame is formed with a pair of cantilevered latches at opposite sides thereof, and the socket body correspondingly provides a pair of locking section to engage with the cantilevered latches.

11. A land grid array (LGA) connector assembly comprising:
a socket body having a plurality of contacts correspondingly received therein;
a spring mechanism disposed on the socket body;
a floating frame defining a plurality of receiving sections floated on the spring mechanism and vertically movable with respect to the socket body;
a stiffener disposed right round the socket body and the floating frame;
a socket plate and a load lever respectively mounted to opposite ends of the stiffener, and;
an LGA package having a bottom surface rest on the receiving sections, the floating frame being movable between a free state in which the bottom surface of the LGA package do not engage with the contacts and a compressed state in which the bottom surface of the LGA package resiliently register with the corresponding contacts received in the socket body.

12. The LGA connector assembly as defined in claim 11, wherein the spring mechanism is a plurality of push fingers set around the socket body.

13. The LGA connector assembly as defined in claim 12, wherein a pair of push fingers extending toward each other is provided at one side of the socket body, and a pair of push fingers extending away from each other is correspondingly formed at an opposite side of the socket body.

14. The LGA connector assembly as defined in claim 13, wherein each push finger comprises a connecting section integrally formed with the socket body, a cantilevered arm connected to the connecting section, and a curved bugle provided at a distal end of the cantilevered arm and extending toward the floating frame.

15. The LGA connector assembly as defined in claim 11, wherein the spring mechanism is a plurality of springs arranged between the floating frame and the socket body.

16. The LGA connector assembly as defined in claim 11, wherein the socket body comprises a plurality of walls with a plurality of protrusions formed thereon, and the floating frame is correspondingly provided with a plurality of guiding grooves to receive the protrusions.

17. The LGA connector assembly as defined in claim 16, wherein at least one protrusion has a configuration different from those of other protrusions.

18. The LGA connector assembly as defined in claim 11, wherein the receiving section is recessed downwardly with respect to an upper surface of the socket body.

19. The LGA connector assembly as defined in claim 11, wherein the floating frame is formed with a pair of cantilevered latches at opposite sides thereof, and the socket body correspondingly provides a pair of locking section to engage with the cantilevered latches.

* * * * *